United States Patent [19]
Cerquone et al.

[11] Patent Number: 5,165,161
[45] Date of Patent: Nov. 24, 1992

[54] CABLE MAKING AND TESTING APPARATUS

[75] Inventors: Stephen M. Cerquone; Michael Morris, both of Harrisburg; Joseph F. Stachura, Lebanon, all of Pa.

[73] Assignee: AMP Incorporated, Harrisburg, Pa.

[21] Appl. No.: 750,676

[22] Filed: Aug. 27, 1991

[51] Int. Cl.⁵ .......................................... G01R 31/02
[52] U.S. Cl. ........................................ 29/593; 29/753; 324/538
[58] Field of Search ............... 29/593, 753, 749, 854; 324/538, 539

[56] References Cited

U.S. PATENT DOCUMENTS

| | | |
|---|---|---|
| 2,775,283 | 12/1956 | Greer .................................. 29/753 |
| 4,285,118 | 8/1981 | Peppler et al. ..................... 29/593 |
| 4,627,157 | 12/1986 | Campisi et al. .................... 29/593 |
| 4,902,968 | 2/1990 | Sugimoto ........................... 324/538 |

*Primary Examiner*—P. W. Echols
*Attorney, Agent, or Firm*—William B. Noll

[57] ABSTRACT

A cable making machine for making and electrically testing a cable assembly is disclosed. The machine includes a test circuit for effecting the electrical tests and probe members for electrically connecting the test circuit to the contacts of the connectors being terminated to the cable. Spring members bias the metal probe members toward the connector contacts. A latch is provided for releasably holding the connectors in position within the machine against the outwardly directed force of the spring biased probe members. A visual indicator is also provided that is indicative that the connector is fully seated within the machine prior to terminating the connector to the cable.

10 Claims, 6 Drawing Sheets

CABLE MAKING AND TESTING APPARATUS

This invention is related to apparatus for making cable assemblies and performing electrical testing thereof.

BACKGROUND OF THE INVENTION

Relatively small quantities of cable assemblies are typically manufactured by means of hand operated bench mounted machines. This is especially the case where the cable assembly is composed of a planar, multi-conductor cable terminated to insulation displacement contacts, insulation piercing contacts, or similar contacts housed in modular plug type connectors. Such cable assemblies are in widespread use in the communications and computer industries and are beginning to find applications in other industries as well. These bench machines have a terminating station which receives the end of a cable to be terminated and a connector already placed in position on the end of the cable, the outer jacket of the cable having been previously removed. Some of these machines include the capability to perform electrical tests of the terminations by means of test probes which make electrical contact with the connector contacts terminated to the two ends of the cable. When manually inserting a connector and associated cable into the terminating station these test probes are engaged by the connector contacts and must be pushed back by compressing their springs until the connector is fully seated within the terminating station. The connector is then held there in position against the force of the probe springs while the machine is actuated to effect the termination. However, there is no assurance that the connector remains fully seated within the terminating station until actual termination takes place. This is because, if the operator were to relax the forward pressure urging the connector toward the terminating station, the force of the probe springs would cause the connector to back away from the terminating station prior to actuation of the machine, resulting in a defective termination, damaged connector, or damaged tooling.

What is needed is a mechanism for positively holding the connector in its fully seated position within the terminating station against the countering force of the probes until termination is effected, the terminated connector then being easily and quickly releasable from the machine.

SUMMARY OF THE INVENTION

The present invention includes a latching means for positively holding a connector to be terminated in its fully seated position within the terminating station. The latching means is included in a cable making machine for making and testing the cable assembly. The machine includes a base having a track for receiving and guiding the connector along a path to a terminating station therein, a reciprocating ram arranged to move toward and away from the terminating station, terminating tooling carried by the ram, and test means for electrically testing the completed cable assembly. Probe means is included for electrically connecting the test means to each of the contacts of the connector, the probe means the contacts when the connector is fully seated tending to urge the connector along the path in a direction away from the terminating station. A latch means is provided for locking the connector in its fully seated position in opposition to the urging of the connector away from the terminating station.

DESCRIPTION OF THE PREFERRED EMBODIMENT

Figure 1:
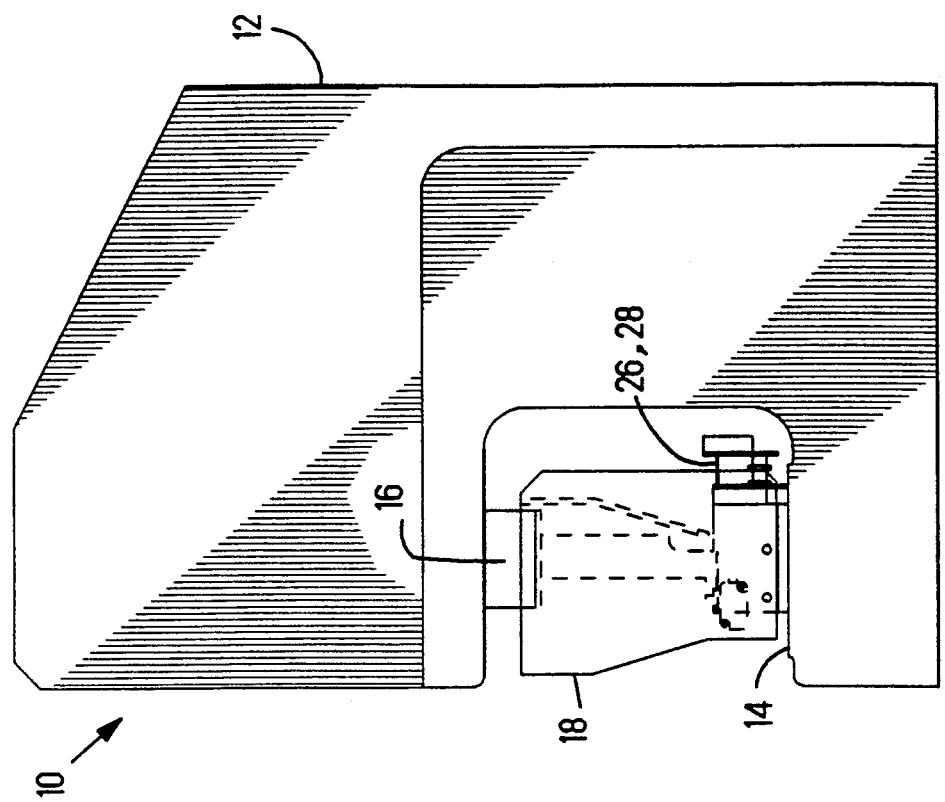
FIG. 1 is a side view of a cable making machine showing a press and terminating module in accordance with the teachings of the present invention.
Figure 2:
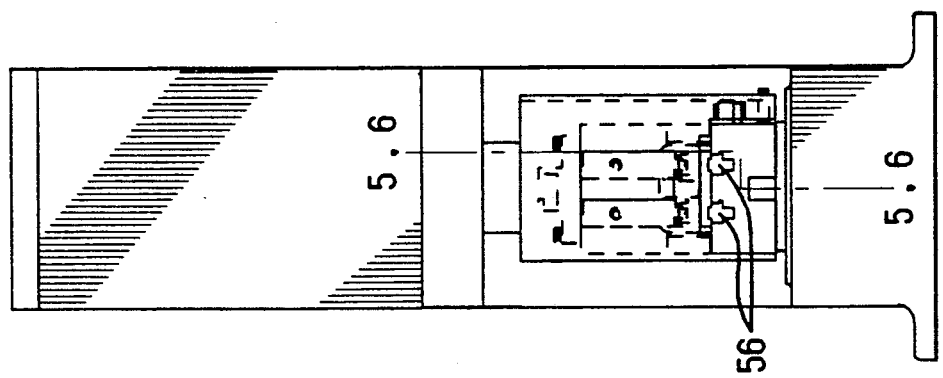
FIG. 2 is a front view of the machine of FIG. 1.
Figure 3:
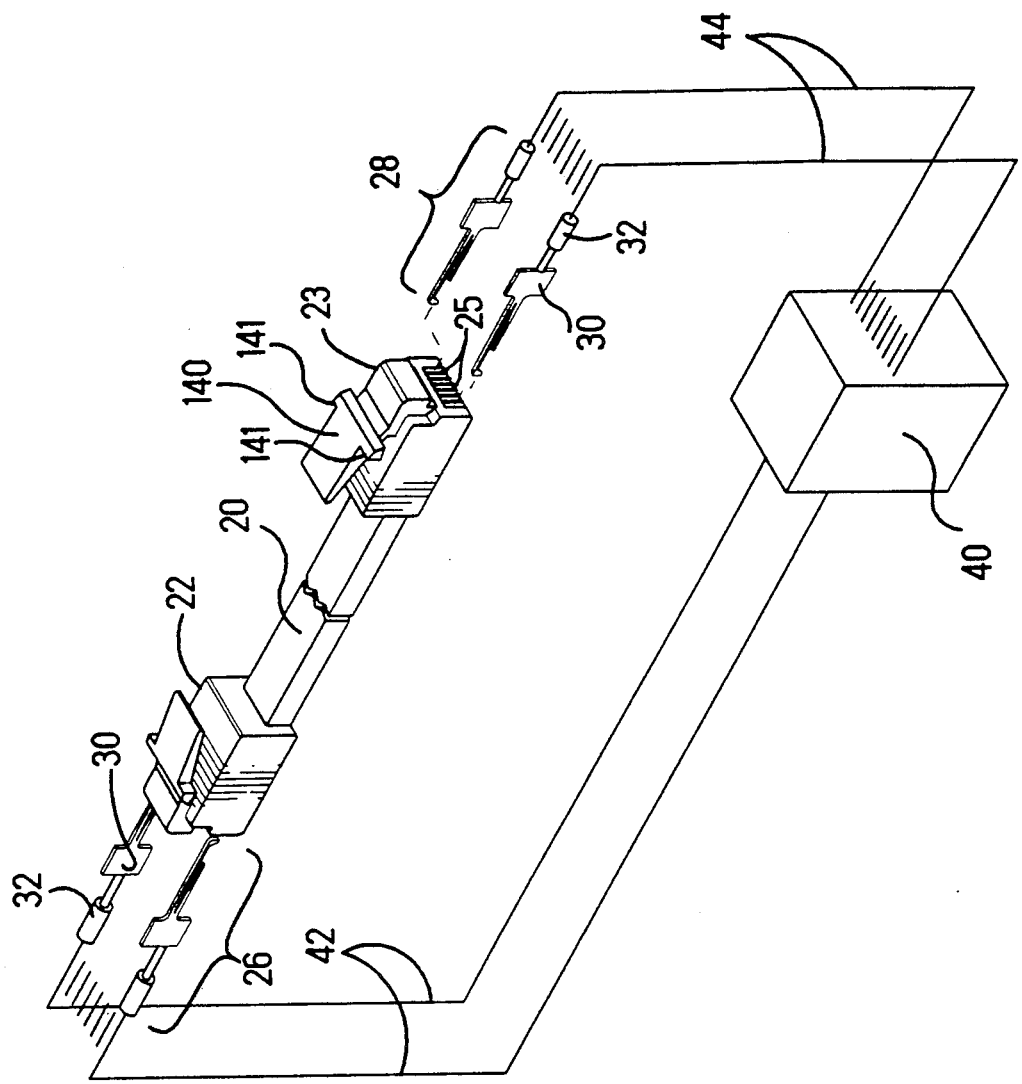
FIG. 3 is a schematic showing the relationship of a typical cable assembly to the testing apparatus of the present invention.

There is shown in FIGS. 1 and 2 a cable making machine 10 including a press or power unit 12 having a mounting plate 14 and a ram 16, moveable toward and away from the mounting plate 14. A connector terminating module 18 is secured to the mounting plate 14 and coupled to the ram 16 in the usual manner so that when the press or power unit 12 is actuated, the ram 16 causes the module 18 to terminate a pair of connectors, one to each end of a length of cable. The cable assembly is shown in FIG. 3 where a length of cable 20 has a connector 22,23, in the present example a modular plug, attached to each end. An array of probes 26 is arranged to engage and make electrical contact with the contacts 25 of the modular plug 22 and a second array of probes 28 is arranged to engage and make electrical contact with the contacts 25 of the other modular plug 23. Each individual probe of the two arrays 26 and 28 is composed of a probe member 30 spring biased toward the modular plugs 22 and 23 by a spring member 32 so that the probes engage and are maintained in good electrical contact with the individual contacts 25 of the plugs. As shown in FIG. 3, the two arrays of probes 26 and 28 are interconnected to a test module 40 by means of the circuits 42 and 44 respectively.

Figure 4:
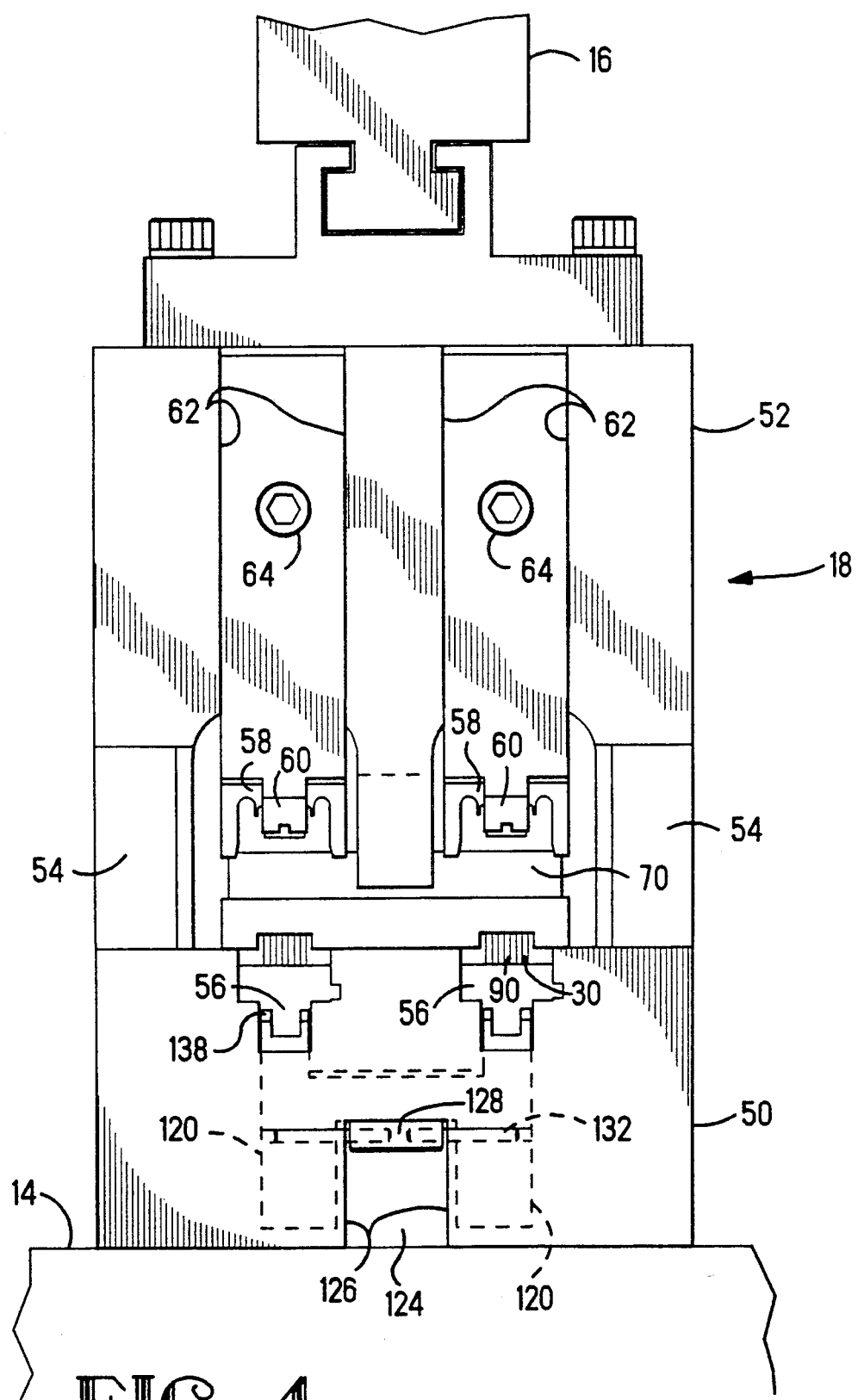
FIG. 4 is an enlarged view of a portion of the machine shown in FIG. 2.

There is shown in FIG. 4 a front view of the connector terminating module 18 having a base 50 attached to the mounting plate 14 and a reciprocating member 52, coupled to and carried by the ram 16. The reciprocating member 52 includes a pair of guide legs 54 which are accommodated in appropriately sized openings in the base 50 to very precisely align the member 52 with the base 50. A pair of tracks 56 are formed in the base 50 for receiving the connectors 22 and 23 for termination to the cable 20. The tracks 56 receive and guide the connectors 22 and 23 along a path to a terminating station 57 where the connectors are fully seated. A pair of contact engaging stuffing bars 58 and cable strain relief bars 60 are arranged within grooves 62 formed in the front surface of the reciprocating member 52 and secured in place by the screw fasteners 64. The grooves 62 are positioned so that the stuffing bars 58 and strain relief bars 60 are in precise vertical alignment with the tracks 56. Thus, with the connectors 22 and 23 fully seated into the terminating station 57, the stuffing bars 58 will accurately engage the contacts 25 and properly set them into their respective connector housing as the ram 16 causes the reciprocating member 52 to move fully toward the base 50.

Figure 5:
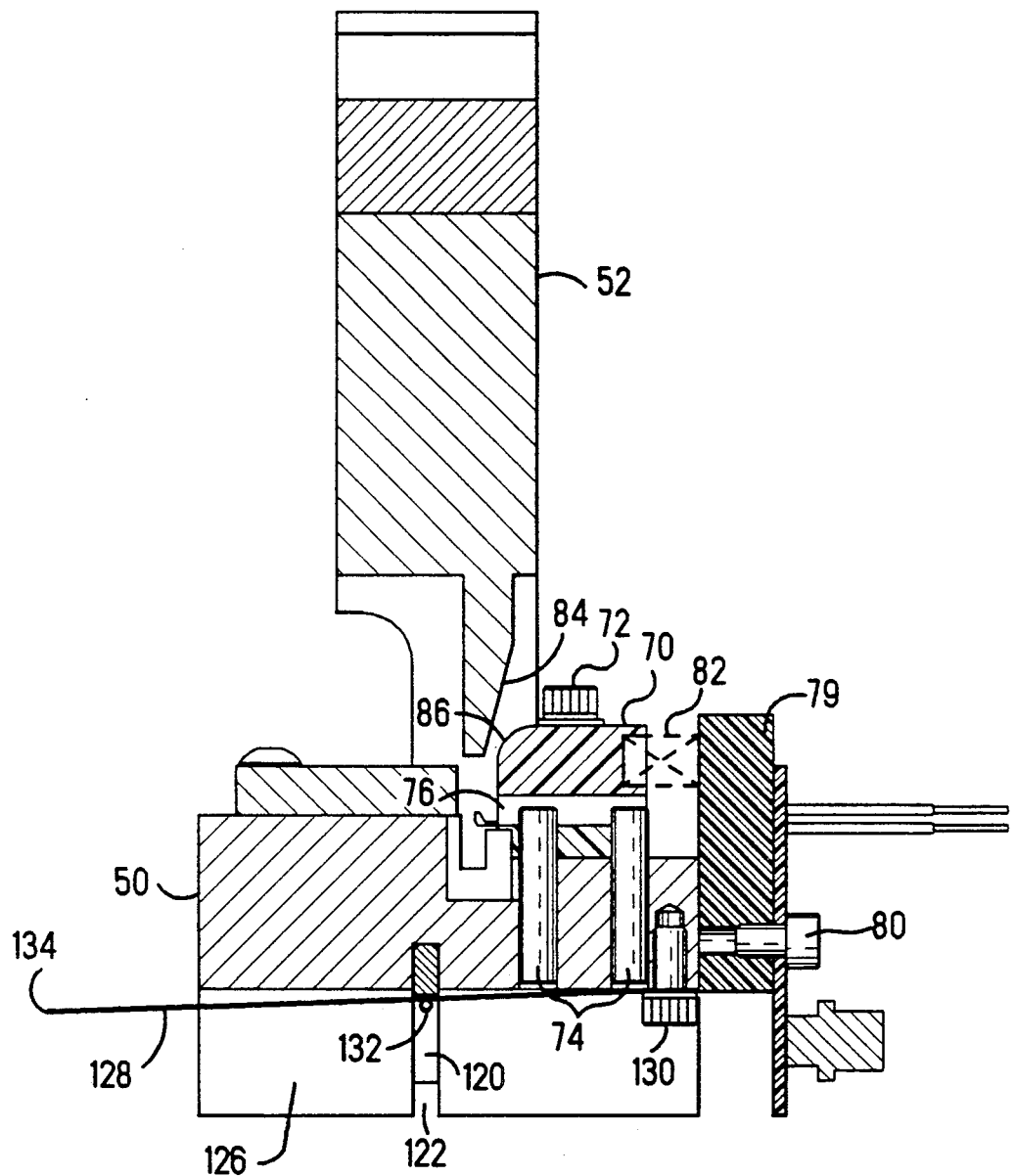
FIG. 5 is a cross-sectional view taken along the lines 5—5 of FIG. 2.

As shown in FIGS. 4 and 5, an insulating guide block 70 is movably coupled to the base 50 by means of the two screw fasteners 72 and the two pins 74 which are pressed into the base 50. The screw fasteners 72 pass through two elongated holes in the block 70 and into threaded holes in the base 50. A slot 76 is disposed in the guide block 70 within which the two pins 74 extend so that the guide block 70 may slide a small amount left in the slot 76. The two screw fasteners 72 are arranged to limit vertical movement of the block 70 while permitting the side to side movement. A second insulating spacer plate 79 is secured to the base 50 between the base 50 and the guide block 70 for a purpose that will be addressed below. A second insulating plate 79 is secured to the base 50 by means of the screw fasteners 80. A resilient member 82, such as a compression spring, is arranged between the plate 79 and the guide block 70 so that the guide block 70 is urged to its left most position, as viewed in FIG. 5. The reciprocating member 52 includes a cam surface 84 which will, upon downward movement of the member 52, engage the surface 86 of the guide block 70 causing it to slide to the right, as view in FIG. 5, against the urging of the resilient member 82.

The guide block 70 has two groups of spaced probe slots 90 disposed in the side facing the spacer plate 78, one group being opposite each of the tracks 56. The slots 90 are each arranged to slidingly receive a probe member 30, which in the present example has a substantially rectangular cross section. In this example the top surface of the insulating plate 78 serves to enclose the bottom of the slot 90 so that the probe member 30 can slide along this surface. The individual slots 90 are arranged so that each is in alignment with and adjacent to a contact 25 of the connectors 22 and 23, there being one slot 90 for each contact 25. In the present example there are 10 such contacts and associated slots for each of the two groups of probes.

Figure 6:
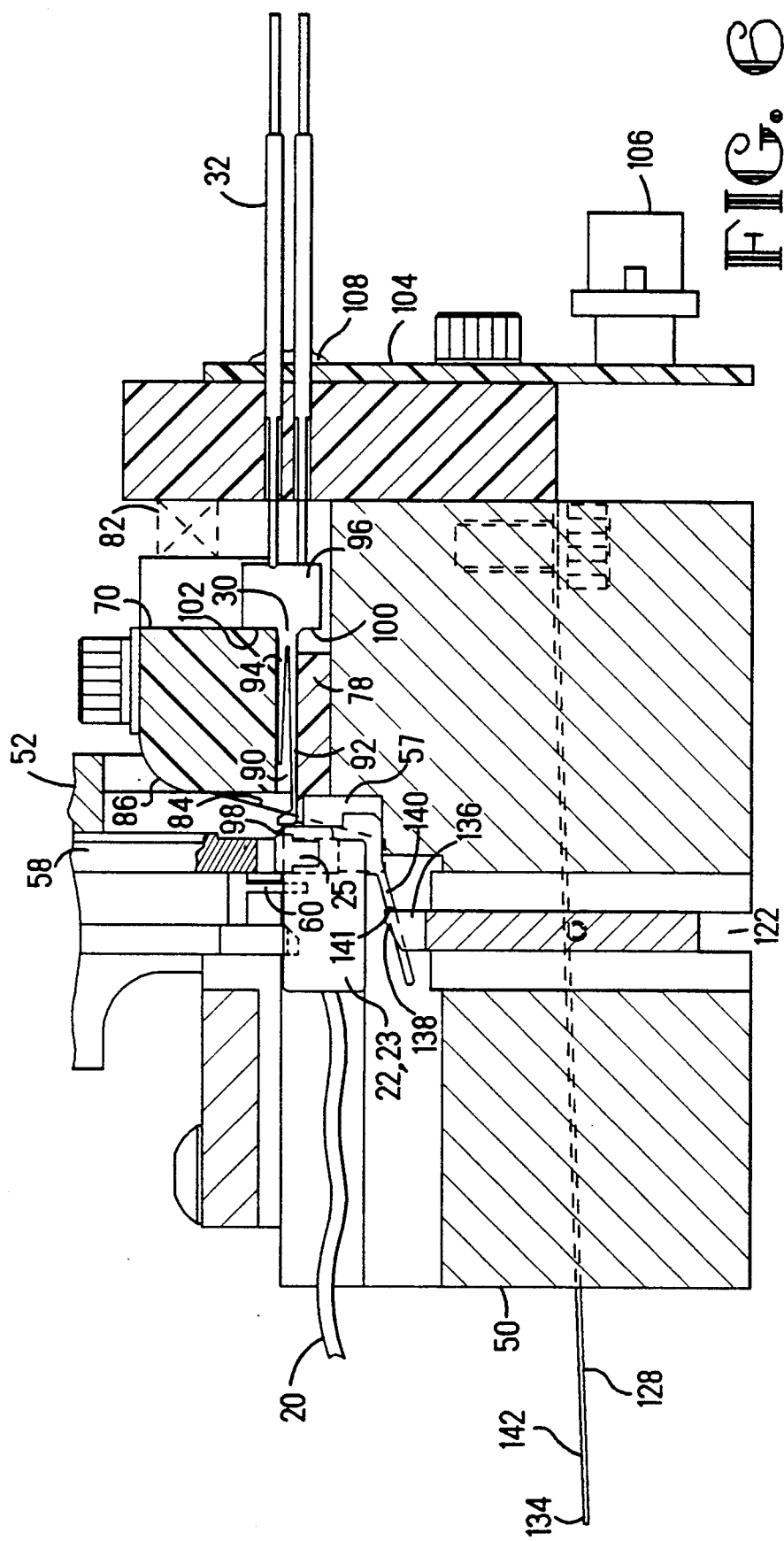
FIG. 6 is a cross-sectional view taken along the lines 6—6 of FIG. 2 showing the probe member of the present invention engaged and disengaged respectively.
Figure 7:
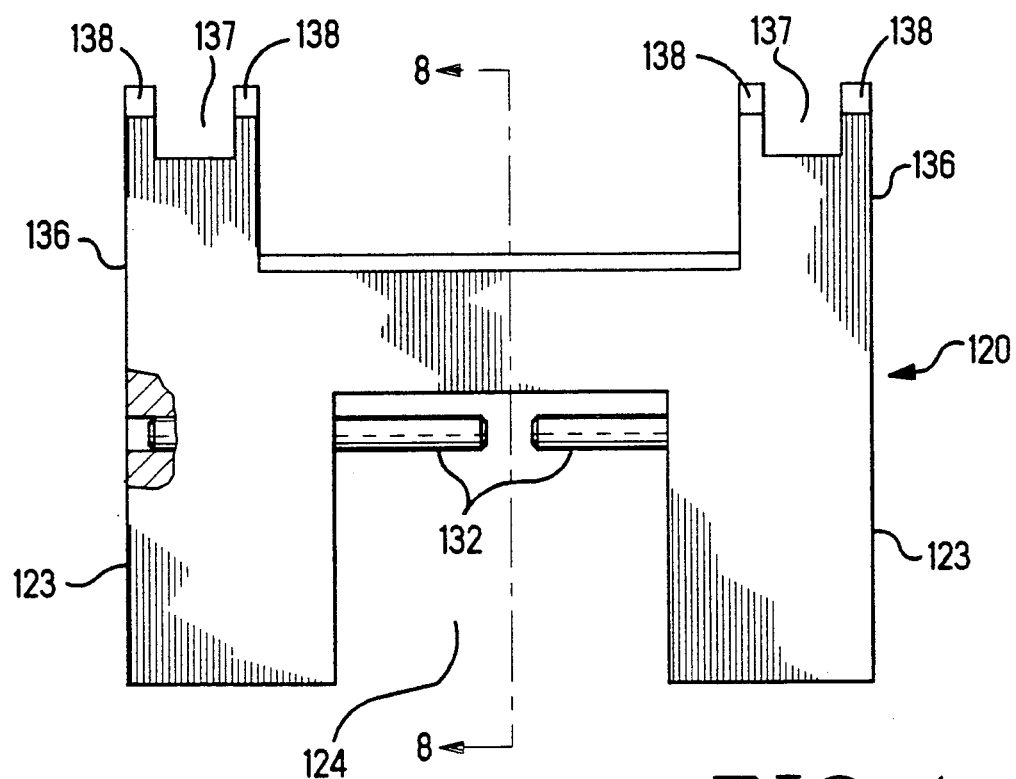
FIG. 7 is a front view of the latch member.
Figure 8:
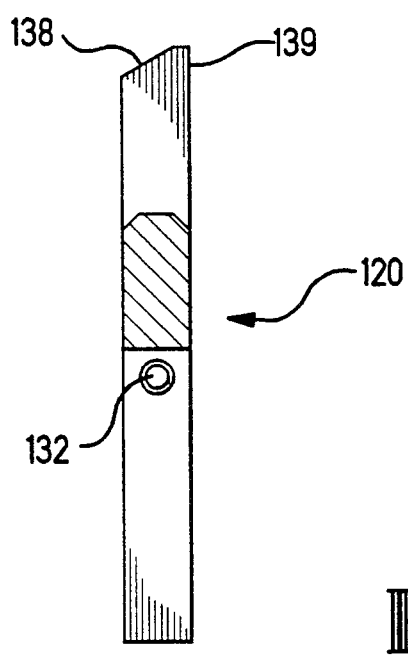
FIG. 8 is a cross-sectional view taken along the lines 8—8 in FIG. 7.

The probe members 30 include an elongated body portion that is substantially rectangular in cross section, as stated above, and consists of a lower cantilevered beam 92 and an upper cantilevered beam 94, both of which extend from a somewhat enlarged shank 96. A contacting surface 98 is disposed on the upturned end of the lower beam 92 for making electrical contact with a respective connector contact 25. The shank 96 includes a lower stop surface 100 which abuts the edge of the insulating plate 78 to limit movement of the probe members 30 toward the connectors 22,23, and an upper stop surface 102 which abuts the right edge, as viewed in FIG. 6, of the guide block 70 when the guide block is moved to the right as shown. Such movement of the guide block 70 will necessarily move all of the probe members 30 to the right. There is an individual spring member 32 in electrical engagement with the shank 96 of each probe member 30, urging the member 30 toward the left, as viewed in FIG. 6. The spring members 32 consist of an outer metal tube and an inner metal rod which freely slides within the tube. A coil spring within the tube biases the rod to the left as viewed in FIG. 6. A printed circuit board 104 is attached to the second insulating plate 79 as shown in FIGS. 5 and 6, and includes an electrical connector 106 mounted thereto. The outer surfaces of the tubes are soldered, as at 108 in FIG. 6, to metalized circuits which are on the circuit board 104 and interconnect to the pins of the connector 106. Thus, the circuits 42 and 44, as shown in FIG. 3, can be plugged into the connector 106 to electrically connect the probe members 30 to the test used as probe members, see the probe and its mounting as disclosed in the above referenced U.S. Pat. No. 4,285,118, the center to center spacing of these devices is substantially larger than the center to center spacing of the contacts 25 of the connectors 22 and 23. However, by using the relatively thin probe members 30 spaced in correspondence with the contacts 25, the larger spring members 32 can be arranged in two or more rows and staggered so that adjacent probe members 30 are engaged by spring members 32 in different rows. A slight V-notch is formed in the ends of each of the rods of the spring members 32 where they engage the shanks 96 of the probe members 30 to help maintain their alignment. While the spring members 32 having this particular rod and tube construction are shown, other spring member structures may advantageously be utilized in the practice of the present invention.

A connector latching mechanism is shown in FIGS. 4 through 8 consisting of a latch member 120 which slides freely in a vertically disposed opening or slot 122 formed in the base 50 allowing the latch member to move in a direction toward the terminating station and in an opposite direction. The latch member 120 is a substantially flat plate having a pair of oppositely #disposed guide edges 123 which are slidingly received in the opening 122. An opening 124 in the latch member 120 is in alignment with a slot 126 formed in the bottom of the base 50, as best seen in FIGS. 4 and 5. A relatively long, thin leaf spring 128 is disposed within the slot 126 and secured at one end to the base 50 by also passes through the opening 124 of the latch member 120 and is held in place by a pair of pins 132 that are pressed into a hole in the latch member and spans most of the opening 124. The free end 134 of the spring member 128 projects beyond the base 50 as shown in FIGS. 5 and 6. The latch member 120 includes a pair of projections 136, each of which has a camming surface 138 and adjacent abutting surface 139. The two projections, each having a clearance opening 137 for a purpose that will be explained below, are in alignment with the two tracks 56 and biased upwardly by the leaf spring 128 so that when the connectors 22 and 23 are inserted into the tracks 56, a tab 140 of each of the connectors engages the camming surface 138 causing the latch member 120 to move downwardly in the opening 122 against the bias force of the leaf spring 128. When the connectors 22 and 23 are fully inserted, the tabs 140 clear the tops of the projections 136 allowing the latch member 120 to move upwardly behind the tabs so that the abutting surfaces 139 engage a portion 141 of the tabs 140 while the tails of the tabs 140 extend into the clearance opening 137. The connectors 22 and 23 are thereby latched in their fully seated position as shown in FIG. 6. As the latch member moves upwardly behind the tabs, a distinct audible sound is heard and the end 134 of the leaf spring 128 snaps quickly upwardly providing a visual indication that both connectors 22 and 23 are fully seated in the terminating station and that the press may now be actuated. After termination of the connectors 22 and 23 to the cable 20, the cable assembly is removed by depressing the leaf spring 128, thereby causing the latch member 120 to move downwardly in the opening 122, and removing the connectors from the tracks 56 by gently pulling the cable 20. The visual indication of the end 134 snapping quickly upwardly is enhanced by ambient light reflected from a relatively reflective surface 142 near the end 134 of the leaf spring 128. This reflective surface 142 can be arranged to reflect either ambient light or, if ambient light is insufficient, light from a source specifically provided for this purpose.

In operation, the ends of a length of cable 20 are prepared and inserted into the connectors 22 and 23, which are then inserted into the two tracks 56. Note that at this point, the contacts 25 of each of the connectors are in their raised positions, as shown in FIG. 6, although the reciprocating member 52 and stuffing bar 58 would be in their retracted, full up, positions. As insertion of the connectors into the tracks 56 continues, the tabs 140 engage the camming surfaces 138 and the right most edge of the contacts 25 engage the contacting surfaces 98 of the probe members 30. As insertion continues the latch member 120 is cammed downwardly, as set forth above, and the probe members 30 are caused to slide to the right, as viewed in FIG. 6, thereby causing the rods to telescope into the tubes of the spring members 32 against the biasing force of the springs contained therein. When the tabs 140 pass over the top of the latch member 120 and the latch member moves upwardly toward the terminating station into its latched position, the connectors 22 and 23 are fully seated and ready for termination. As this occurs the end 134 of the leaf spring 128 snaps upwardly providing a visual indicator that the connectors are fully seated. The press 12 is then actuated to cause the ram 16 and reciprocating member 52 to move downwardly toward the base 50. As this occurs, and prior to the stuffing bar 58 engaging the contacts 25, the cam surface 84 engages the surface 86 of the insulating guide block 70 causing the guide block to slide to the right and against the stop surfaces 102 of the probe members 30, in turn causing the probe members 30 to slide to the right within their openings 90 so that the contact surfaces 98 disengage and move away from the contacts 25 as shown in FIG. 6. At this point the stuffing bar 58 engages the top of the contacts 25 pushing them downwardly into the connector bodies and into engaging contact with the individual conductors of the cable 20. As the press 12 continues its cycle, the ram 16 and reciprocating member 52 move upwardly away from the base 50 allowing the guide block 70 to move to the left under the urging of the spring 82 thereby allowing the probe members 30 to reengage the contacts 25. At this point the test module 40 automatically tests the terminations and indicates whether or not the finished cable assembly has passed the test. The leaf spring 128 is then depressed to cause the latch member 120 to move downwardly thereby releasing the connectors 22 and 23, the cable assembly removed, and the cycle repeated.

An important advantage of the present invention is that once a connector is inserted into the machine so that it is fully seated within the terminating station, it is latched and held in this position against the biasing force of the probes so that its contacts can be properly terminated to the conductors of a cable without danger of the connector inadvertently slipping out of position and damaging the tooling. Additionally, the visual indicator on the latch spring assures that the connector is fully seated within the terminating station.

We claim:

1. In a cable making machine for making and electrically testing a cable assembly including a cable having conductors terminated to contacts of a connector at one end thereof, said machine including a base having a track for receiving and guiding said connector along a path to a terminating station therein, a reciprocating ram arranged to move toward and away from said terminating station, said ram carrying terminating tooling for electrically connecting said contacts to respective ones of said conductors, test means for electrically testing the completed cable assembly, probe means for electrically connecting said test means to each of said contacts, said probe means including probe members in contact with said contacts and first resilient means for urging said probe members against said contacts when said connector is fully seated within said terminating station so that said connector is urged along said path in a direction away from said terminating station, latching means for releasably locking said connector in its fully seated position in said terminating station in opposition to said urging of said connector away from said terminating station.

2. The machine according to claim 1 wherein said latching means includes a latch member coupled to said base and arranged to undergo movement in a direction toward said terminating station and in an opposite direction, and second resilient means for urging said latch member in said direction toward said terminating station and into engagement with said connector thereby effecting said locking of said connector in its fully seated position.

3. The machine according to claim 2 wherein said connector has an outwardly extending tab and said latch member includes a camming surface and adjacent abutting surface arranged so that as said connector is moved along said path toward its fully seated position, said tab engages said camming surface thereby causing said latch member to move in said opposite direction against said urging of said second resilient means until said tab passes said camming surface and said latch member moves in said direction toward said terminating station whereupon said abutting surface engages said tab thereby effecting said holding.

4. The machine according to claim 3 wherein said second resilient means comprises:

(a) an opening through a portion of said latch member; and (b) an elongated spring member having a first end attached to said base and a second end extending through said opening in said latch member, said opening and spring member being arranged so that said spring member pushes against said latch member within said opening to effect said urging of said latch member in a direction toward said terminating station.

5. The machine according to claim 4 wherein said second end of said elongated spring member includes a reflective surface for providing a visual indication that said latch member has moved in said direction toward said terminating station, whereby a change in the reflected ambient light observed from said reflective surface is indicative of movement of said surface and operation of said latch member.

6. The machine according to claim 3 wherein said latch member comprises a substantially flat plate having a pair of oppositely disposed guide edges, and a pair of openings in said base arranged for slidingly receiving said pair of guide edges during said movement of said latch member.

7. The machine according to claim 3 wherein said camming surface and adjacent abutting surface include a clearance opening so that as said connector is moved along said path toward its fully seated position, a first portion of said tab extends into said clearance opening and a second portion of said tab on either side of said first portion effects said engagement with said camming surface and adjacent abutting surface on either side of said clearance opening respectively.

8. The machine according to claim 1 wherein said latching means includes means for providing a visual indication upon effecting said locking of said connector that said connector is in its fully seated position.

9. In a cable making machine for making an electrically testing a cable assembly including a cable having conductors terminated to contacts of a first connector at one end and contacts of a second connector at the other end, said machine including a base having first and second spaced tracks for receiving and guiding said first and second connectors along first and second paths respectively to a terminating station therein, a reciprocating ram arranged to move toward and away from said terminating station, said ram carrying terminating tooling for electrically connecting said contacts of said first and second connectors to respective ones of completed cable assembly, probe means for electrically connecting said test means to each of said contacts, said probe means including probe members in contact with probe members against said contacts when said first and second connectors are fully seated within said terminating station so that said connectors are urged along their respective said paths in a direction away from said terminating station, latch means for releasably locking said first and second connectors in their fully seated positions in said terminating station in opposition to said urging of said connectors away from said terminating station.

10. The machine according to claim 9 wherein said latch member includes two of said camming surfaces and two of said abutting surfaces, being spaced apart and arranged so that each camming surface and its associated abutting surface are in alignment with a different one of said pair of tracks.

* * * * *

UNITED STATES PATENT AND TRADEMARK OFFICE
CERTIFICATE OF CORRECTION

PATENT NO. : 5,165,161
DATED : November 24, 1992
INVENTOR(S) : Stephen M. Cerquone et al.

It is certified that error appears in the above-identified patent and that said Letters Patent is hereby corrected as shown below:

In claim 9, column 7, line 14, "an" should be changed to --and--.

In claim 9, column 8, line 2, --said conductors, test means for electrically testing the-- should be inserted after "respective ones of".

In claim 9, column 8, line 5, --said contacts and first resilient means for urging said-- should be inserted after "in contact with".

Signed and Sealed this

Twelfth Day of October, 1993

Attest:

BRUCE LEHMAN

Attesting Officer   Commissioner of Patents and Trademarks